US012593543B2

(12) United States Patent
Liu et al.

(10) Patent No.: US 12,593,543 B2
(45) Date of Patent: Mar. 31, 2026

(54) DISPLAY MODULE MANUFACTURING METHOD AND DISPLAY SCREEN

(71) Applicant: SHENZHEN SITAN TECHNOLOGY CO., LTD., Guangdong (CN)

(72) Inventors: Zhaojun Liu, Guangdong (CN); Guocai Wu, Guangdong (CN); Weijing Mo, Guangdong (CN)

(73) Assignee: Shenzhen Sitan Technology Co., Ltd., Shenzhen (CN)

( * ) Notice: Subject to any disclaimer, the term of this patent is extended or adjusted under 35 U.S.C. 154(b) by 525 days.

(21) Appl. No.: 18/090,494

(22) Filed: Dec. 29, 2022

(65) Prior Publication Data

US 2023/0134241 A1     May 4, 2023

Related U.S. Application Data

(63) Continuation-in-part of application No. PCT/CN2020/100186, filed on Jul. 3, 2020.

(51) Int. Cl.
H01L 25/075          (2006.01)
H10H 20/841          (2025.01)
          (Continued)

(52) U.S. Cl.
CPC ..... *H10H 20/8514* (2025.01); *H01L 25/0753* (2013.01); *H10H 20/841* (2025.01); *H10H 29/012* (2025.01); *H10H 29/45* (2025.01); *H10H 29/8421* (2025.01); *H10H 29/8516* (2025.01); *H10H 29/8517* (2025.01); *H10H 20/032* (2025.01); *H10H 20/034* (2025.01);
          (Continued)

(58) Field of Classification Search
CPC ............. H10H 29/012; H10H 29/8421; H10H 29/851; H10H 29/8511; H10H 29/8512; H10H 29/8513; H10H 29/8514; H10H 29/8517; H01L 25/0753; H01L 25/167
See application file for complete search history.

(56) References Cited

U.S. PATENT DOCUMENTS

2020/0075817 A1     3/2020   Li et al.

FOREIGN PATENT DOCUMENTS

CN          102214650          10/2011
CN          102907176          1/2013
          (Continued)

OTHER PUBLICATIONS

"International Search Report (Form PCT/ISA/210) of PCT/CN2020/100186," mailed on Apr. 1, 2021, pp. 1-4.
          (Continued)

*Primary Examiner* — Zandra V Smith
*Assistant Examiner* — Molly K Reida

(57)          ABSTRACT

The present application discloses a manufacturing method for a display module and a display screen. The method includes: forming a semiconductor device by pre-processing a semiconductor epitaxial wafer; forming a first transparent layer on a substrate surface of the semiconductor device; forming a first opening exposing the substrate by etching the first transparent layer; forming a first quantum dot layer on the substrate surface exposed by the first opening and the surface of the first transparent layer; etching away the first quantum dot layer in the outer region of the first opening, and remaining the first quantum dot layer inside the first opening; and forming a DBR film layer that filters blue light.

17 Claims, 9 Drawing Sheets

(51) Int. Cl.

| | |
|---|---|
| *H10H 20/851* | (2025.01) |
| *H10H 29/01* | (2025.01) |
| *H10H 29/45* | (2025.01) |
| *H10H 29/80* | (2025.01) |
| *H10H 29/85* | (2025.01) |
| *H10H 29/851* | (2025.01) |
| H10H 20/01 | (2025.01) |
| H10H 20/832 | (2025.01) |

(52) U.S. Cl.
CPC ....... *H10H 20/0361* (2025.01); *H10H 20/835* (2025.01)

(56) References Cited

FOREIGN PATENT DOCUMENTS

| CN | 103035852 | 4/2013 |
|---|---|---|
| CN | 105259694 | 1/2016 |
| CN | 108155276 | 6/2018 |
| CN | 108598105 | 9/2018 |
| CN | 108987613 | 12/2018 |
| CN | 110024484 | 7/2019 |
| CN | 110492013 | 11/2019 |
| CN | 209640519 | 11/2019 |
| CN | 110854257 | 2/2020 |
| CN | 111063708 | 4/2020 |
| CN | 111257983 | 6/2020 |
| CN | 111326621 | 6/2020 |
| JP | 2001237075 | 8/2001 |
| JP | 2009135183 | 6/2009 |
| JP | 2010086846 | 4/2010 |
| JP | 2015011904 | 1/2015 |
| JP | 2019129163 | 8/2019 |
| WO | 03092333 | 11/2003 |

OTHER PUBLICATIONS

"First Search of China Related Application, Application No. 202010635705.6," May 7, 2021, p. 1-p. 2.
"Supplementary search of China Related Application, Application No. 202010635705.6," Sep. 8, 2021, p. 1.

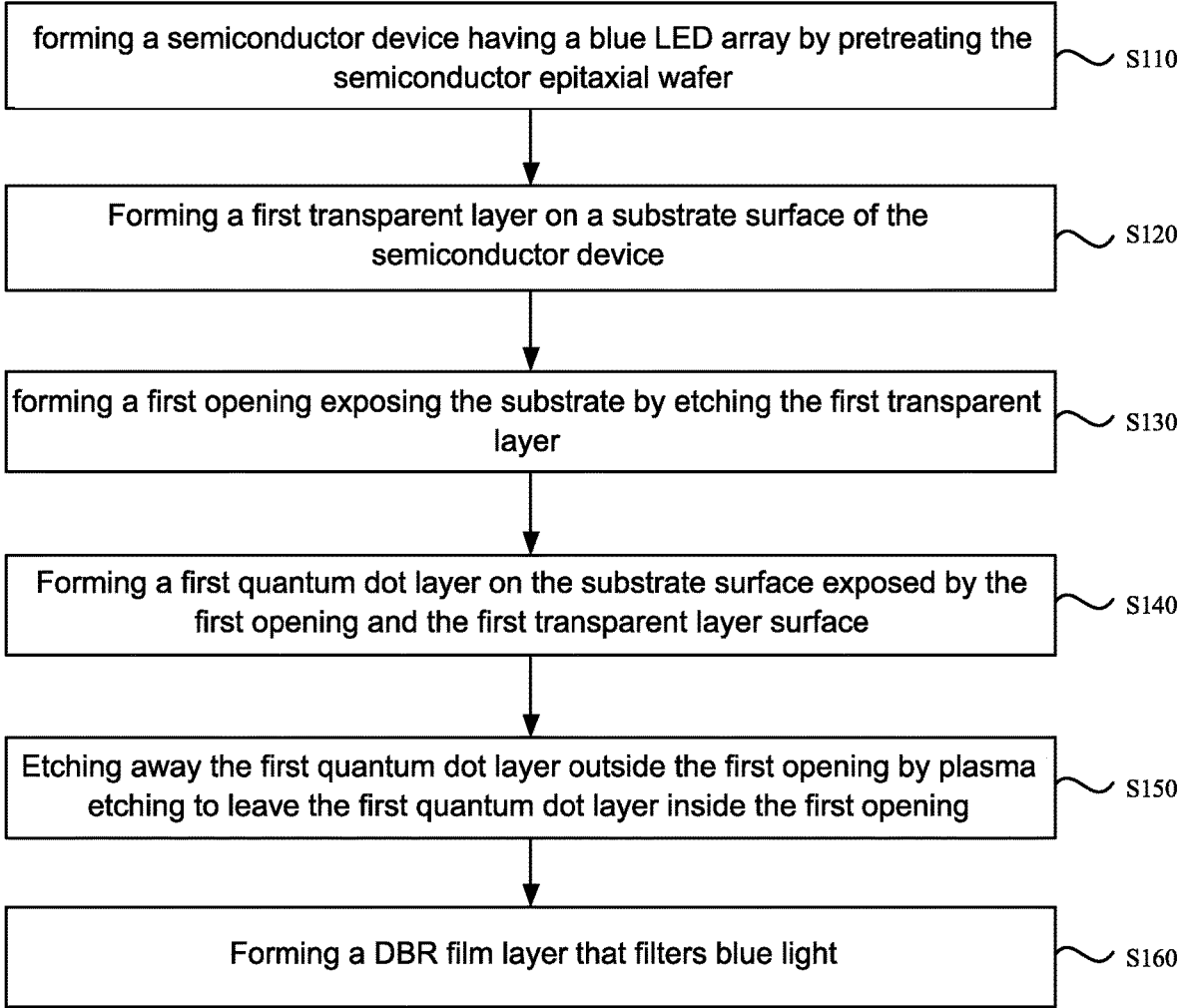

forming a semiconductor device having a blue LED array by pretreating the semiconductor epitaxial wafer    S110

Forming a first transparent layer on a substrate surface of the semiconductor device    S120 forming a first opening exposing the substrate by etching the first transparent layer    S130

Forming a first quantum dot layer on the substrate surface exposed by the first opening and the first transparent layer surface    S140

Etching away the first quantum dot layer outside the first opening by plasma etching to leave the first quantum dot layer inside the first opening    S150

Forming a DBR film layer that filters blue light    S160

FIG. 1

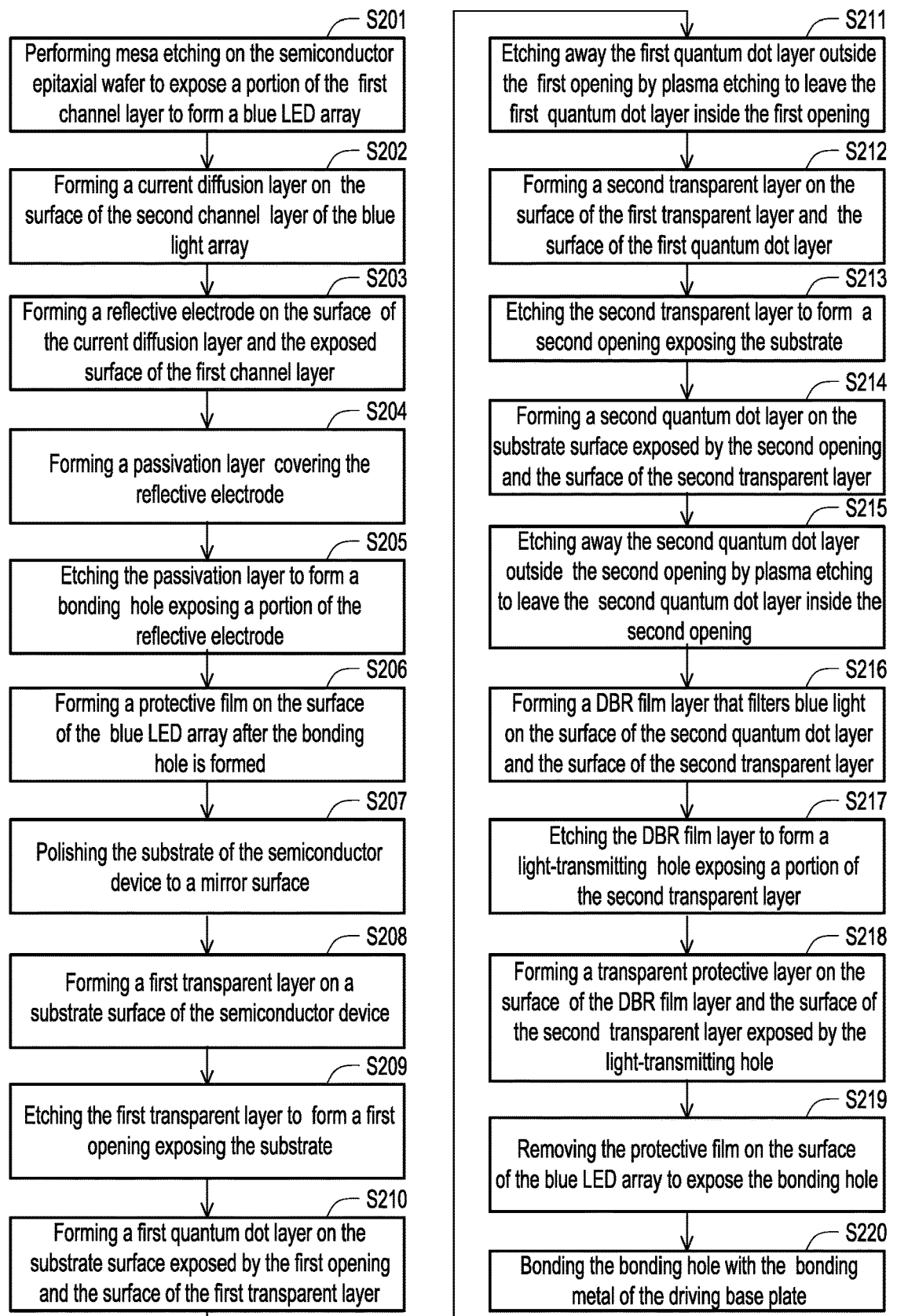

S201
Performing mesa etching on the semiconductor epitaxial wafer to expose a portion of the first channel layer to form a blue LED array

S202
Forming a current diffusion layer on the surface of the second channel layer of the blue light array

S203
Forming a reflective electrode on the surface of the current diffusion layer and the exposed surface of the first channel layer

S204
Forming a passivation layer covering the reflective electrode

S205
Etching the passivation layer to form a bonding hole exposing a portion of the reflective electrode

S206
Forming a protective film on the surface of the blue LED array after the bonding hole is formed

S207
Polishing the substrate of the semiconductor device to a mirror surface

S208
Forming a first transparent layer on a substrate surface of the semiconductor device

S209
Etching the first transparent layer to form a first opening exposing the substrate

S210
Forming a first quantum dot layer on the substrate surface exposed by the first opening and the surface of the first transparent layer

S211
Etching away the first quantum dot layer outside the first opening by plasma etching to leave the first quantum dot layer inside the first opening

S212
Forming a second transparent layer on the surface of the first transparent layer and the surface of the first quantum dot layer

S213
Etching the second transparent layer to form a second opening exposing the substrate

S214
Forming a second quantum dot layer on the substrate surface exposed by the second opening and the surface of the second transparent layer

S215
Etching away the second quantum dot layer outside the second opening by plasma etching to leave the second quantum dot layer inside the second opening

S216
Forming a DBR film layer that filters blue light on the surface of the second quantum dot layer and the surface of the second transparent layer

S217
Etching the DBR film layer to form a light-transmitting hole exposing a portion of the second transparent layer

S218
Forming a transparent protective layer on the surface of the DBR film layer and the surface of the second transparent layer exposed by the light-transmitting hole

S219
Removing the protective film on the surface of the blue LED array to expose the bonding hole

S220
Bonding the bonding hole with the bonding metal of the driving base plate

FIG. 2

DISPLAY MODULE MANUFACTURING METHOD AND DISPLAY SCREEN

CROSS-REFERENCE TO RELATED APPLICATION

This application is a continuation-in-part of international application No. PCT/CN2020/100186, filed on Jul. 3, 2020. The entirety of the above-mentioned patent application is hereby incorporated by reference herein and made a part of this specification.

TECHNICAL FIELD

The embodiments of the present application relate to the technical field of semiconductors, for example, a display module manufacturing method and a display screen.

BACKGROUND

The Light Emitting Diode (LED) display screen is an electronic display screen composed of an LED dot matrix, which is used to display various kinds of information such as text, image, video and other information. The LED display screens are divided into a single-color screen, a double-color screen, and a full-color screen. The single-color screen refers to an LED display screen using one color, the double-color screen refers to an LED display screen using two colors (red and green), and the full-color screen refers to an LED display screen using three colors (red, green, and blue). The full-color screen displays the widest range of colors, so it is widely applied.

In the related art, an LED and a quantum dot are combined to achieve the full-color of a display screen. In the related art, quantum dots are sprayed onto the surface of a blue LED or a deep purple LED device by means of ink-jet printing. The quantum dots are excited by the blue LED or the deep purple LED light source so that the quantum dots emit red light and green light, thereby achieving full-color of the display screen.

However, with the ink-jet printing of quantum dots, the accuracy of printing is usually only in the micron size range.

SUMMARY

The embodiments of the present application provide a display module manufacturing method and a display screen.

In the first aspect, a manufacturing method for a display module provided in an embodiment of the present application comprises:

forming a semiconductor device having a blue LED array by pre-processing a semiconductor epitaxial wafer;

forming a first transparent layer on a substrate surface of the semiconductor device;

forming a first opening exposing the substrate by etching the first transparent layer;

forming a first quantum dot layer on the substrate surface exposed by the first opening and the surface of the first transparent layer;

etching away the first quantum dot layer in the outer region of the first opening by plasma etching, and remaining the first quantum dot layer inside the first opening;

and forming a DBR film layer that filters blue light.

In the second aspect, a display screen provided in an embodiment of the present application comprises multiple display modules, and the display modules are prepared by a manufacturing method for a display module, and the manufacturing method for the display module comprises:

forming a semiconductor device having a blue LED array by pre-processing a semiconductor epitaxial wafer;

forming a first transparent layer on a substrate surface of the semiconductor device;

forming a first opening exposing the substrate by etching the first transparent layer;

forming a first quantum dot layer on the substrate surface exposed by the first opening and a surface of the first transparent layer;

etching away the first quantum dot layer in the outer region of the first opening by plasma etching, and remaining the first quantum dot layer inside the first opening; and forming a DBR film layer that filters blue light.

BRIEF DESCRIPTION OF THE DRAWINGS

FIG. 1 is a schematic view of the flow chart of a manufacturing method for a display module according to one embodiment of the present application.

FIG. 2 is a schematic view of the flow chart of a manufacturing method for a display module according to one embodiment of the present application.

3

Figure 3A:
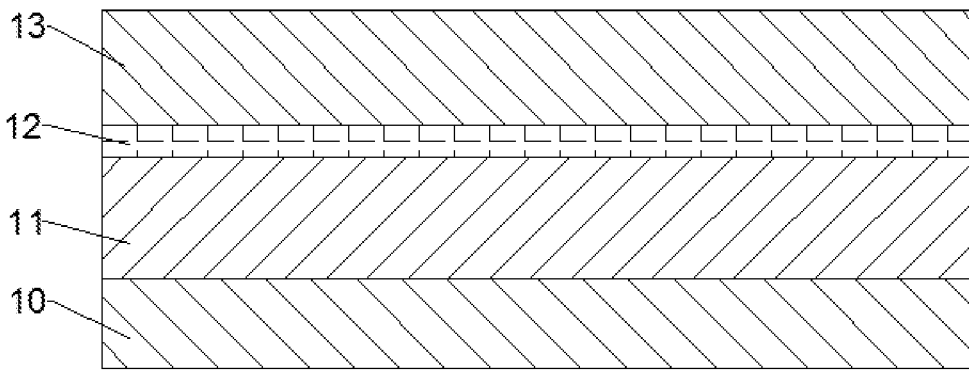
FIG. 3A is a schematic view showing a structure of a semiconductor epitaxial wafer according to one embodiment of the present application.
Figure 3B:
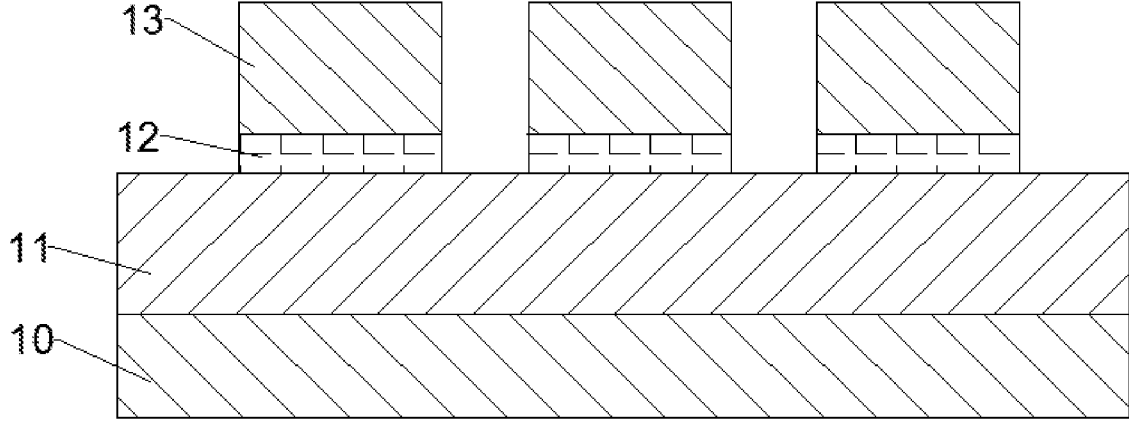
FIG. 3B is a schematic view showing a structure of a semiconductor epitaxial wafer for preliminarily forming a blue LED array according to one embodiment of the present application.
Figure 3C:
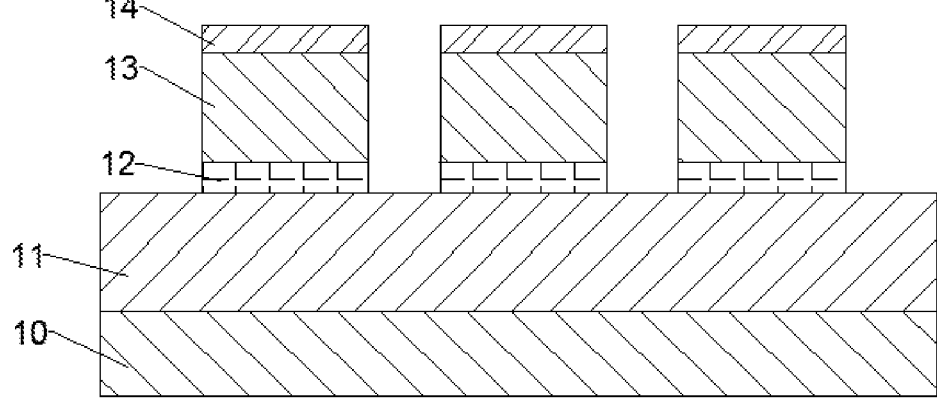
FIG. 3C is a schematic view showing a structure of a semiconductor epitaxial wafer forming a current diffusion layer according to one embodiment of the present application.
Figure 3D:
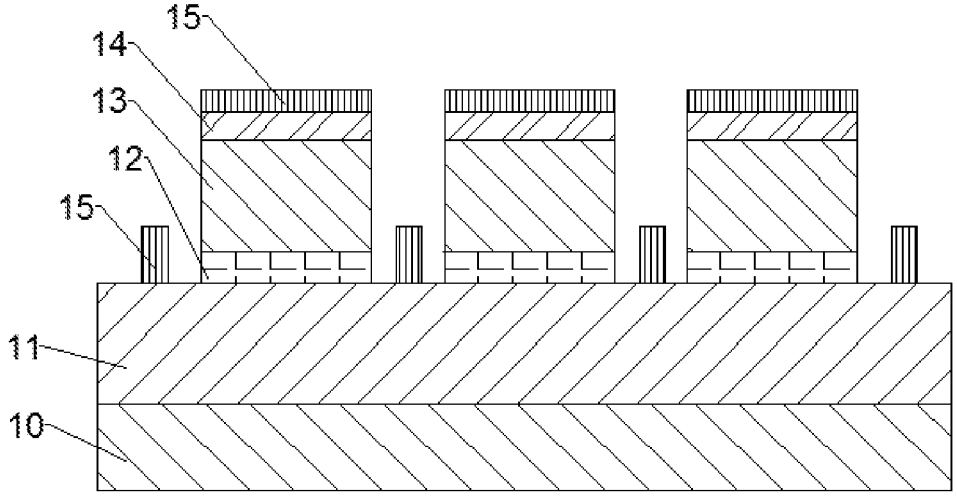
FIG. 3D is a schematic view of a structure of a semiconductor epitaxial wafer forming a reflective electrode according to one embodiment of the present application.
Figure 3E:
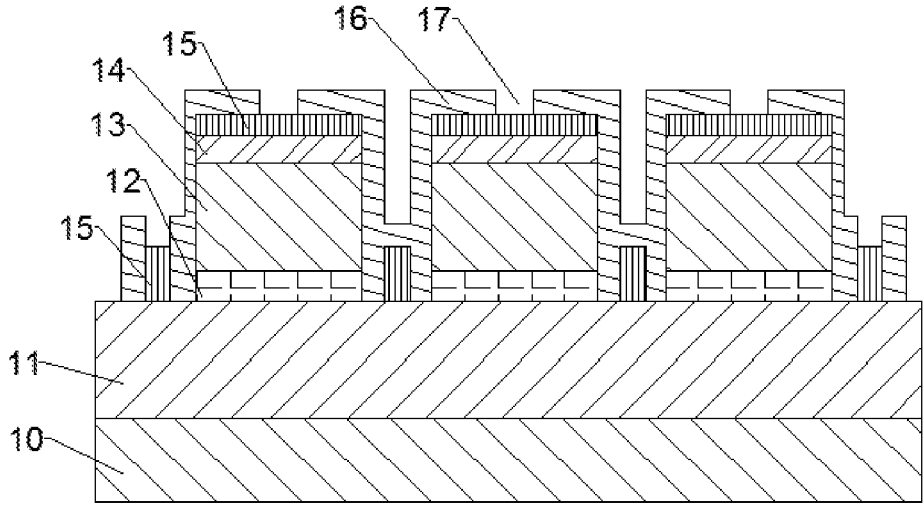
FIG. 3E is a schematic view of a structure of a semiconductor epitaxial wafer forming a passivation layer and bonding hole according to one embodiment of the present application.
Figure 3F:
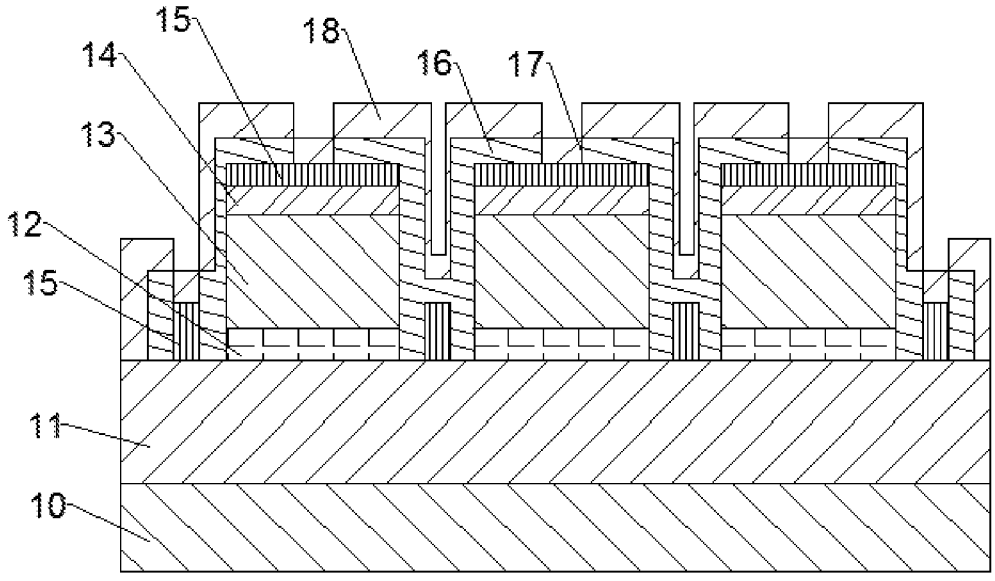
FIG. 3F is a schematic view of a structure of a semiconductor epitaxial wafer forming a protective film according to one embodiment of the present application.
Figure 3G:
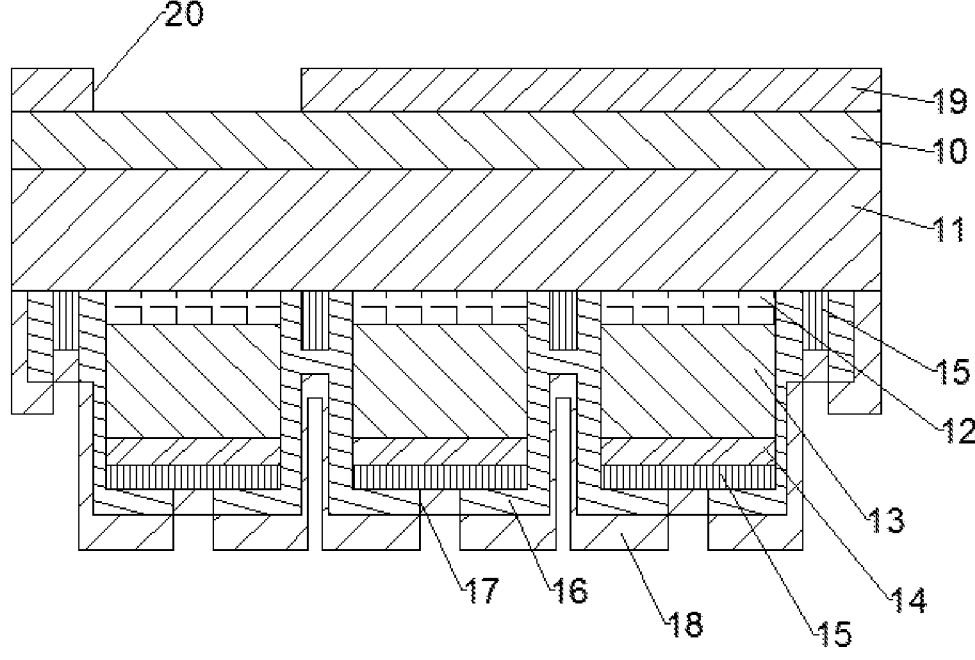
FIG. 3G is a schematic view of a structure of a semiconductor epitaxial wafer forming a first transparent layer according to one embodiment of the present application.
Figure 3H:
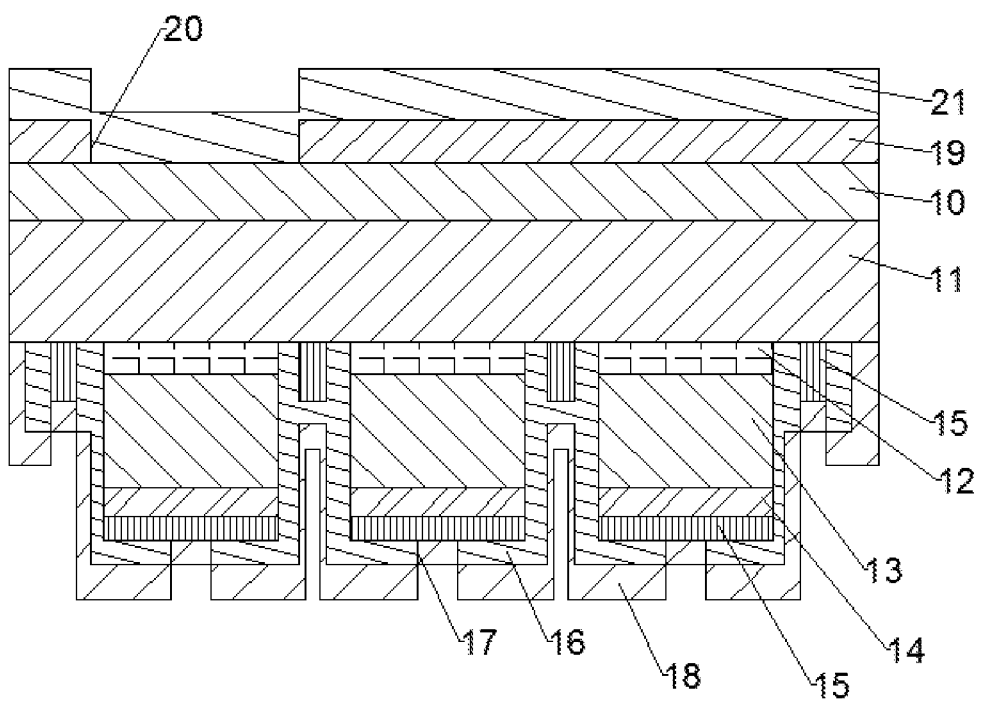
FIG. 3H is a schematic view of a structure of a semiconductor epitaxial wafer forming a first quantum dot layer according to one embodiment of the present application.
Figure 3I:
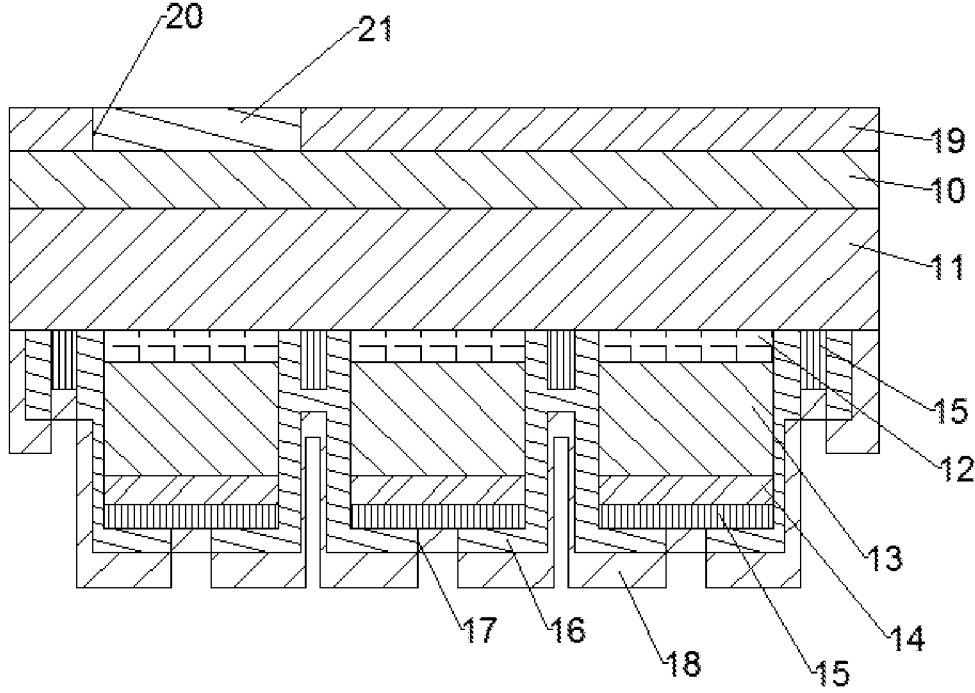
FIG. 3I is a schematic view of a structure of a semiconductor epitaxial wafer after plasma etching is completed according to one embodiment of the present application.
Figure 3J:
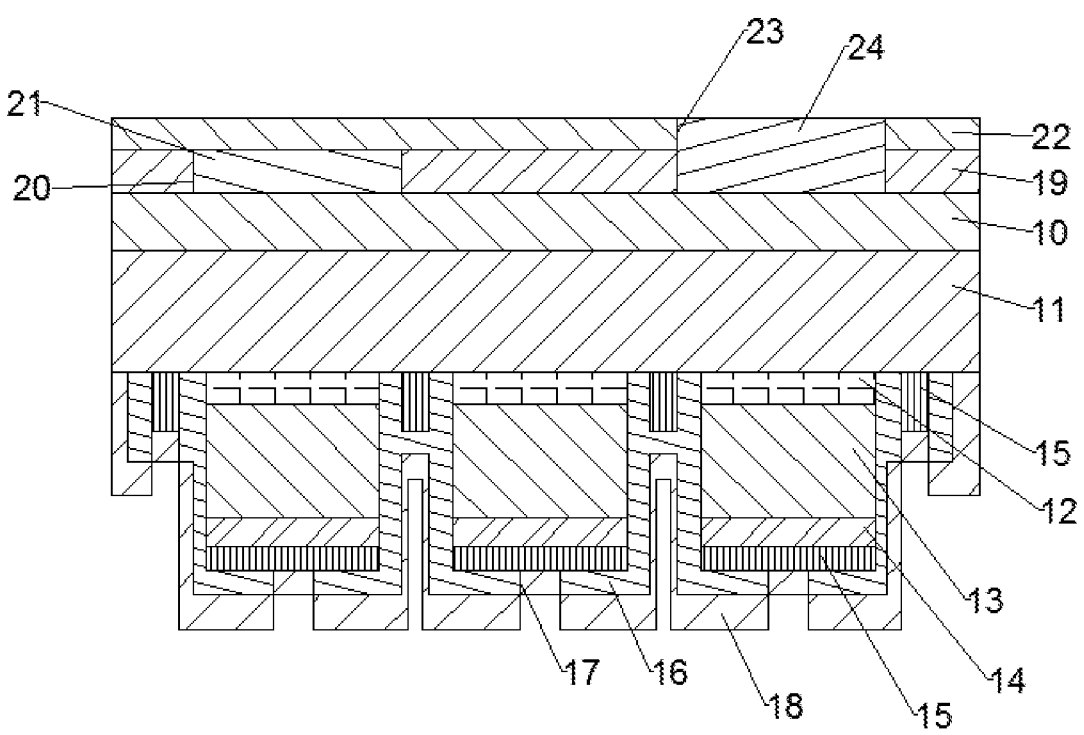
FIG. 3J is a schematic view of a structure of a semiconductor epitaxial wafer for completing the etching of a second quantum dot layer according to one embodiment of the present application.
Figure 3K:
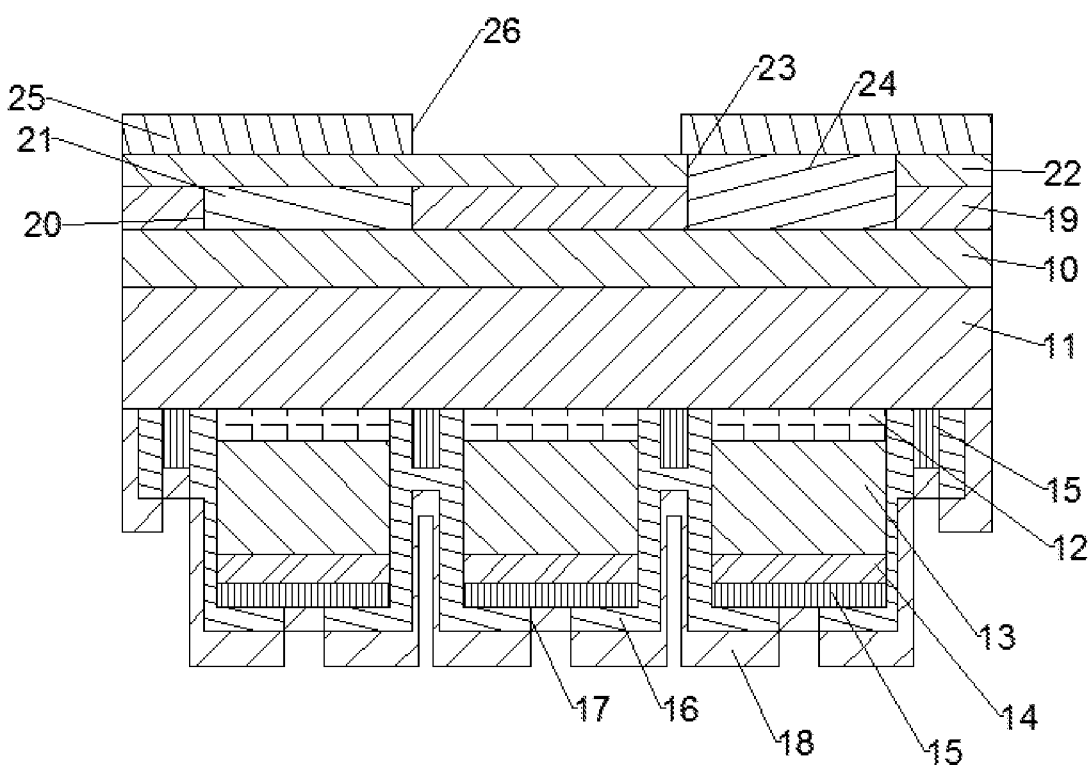
FIG. 3K is a schematic view of a structure of a semiconductor epitaxial wafer forming a DBR film layer according to one embodiment of the present application.
Figure 3L:
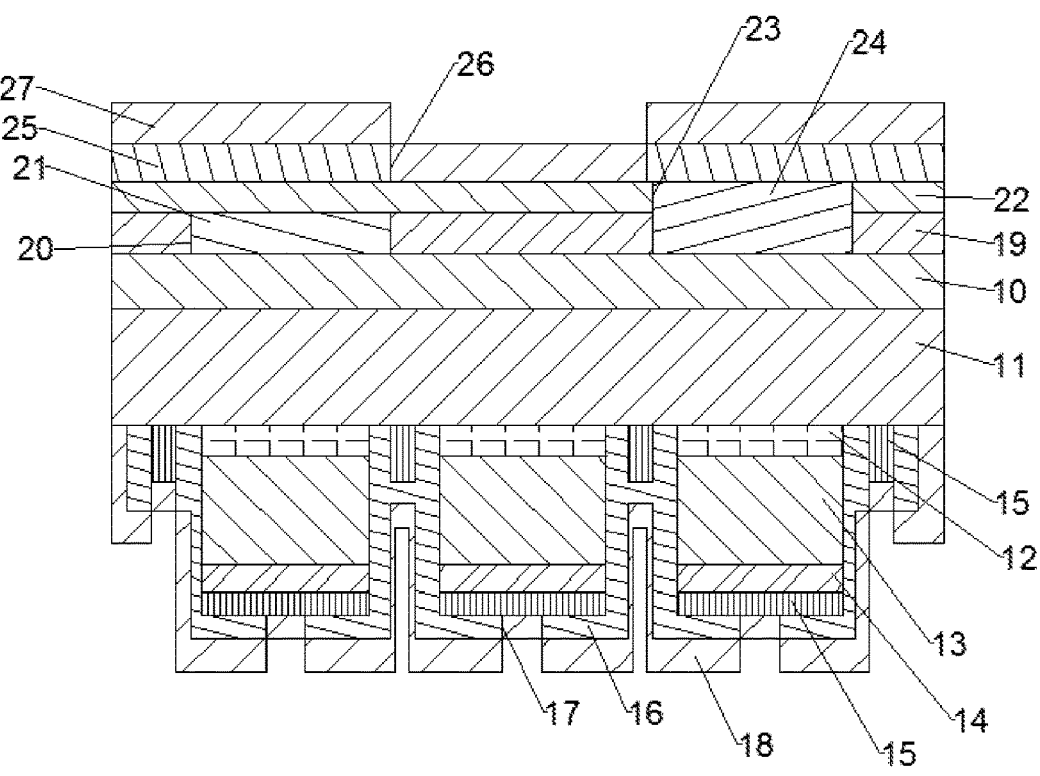
FIG. 3L is a schematic view of a structure of a semiconductor epitaxial wafer forming a transparent protective layer according to one embodiment of the present application.
Figure 3M:
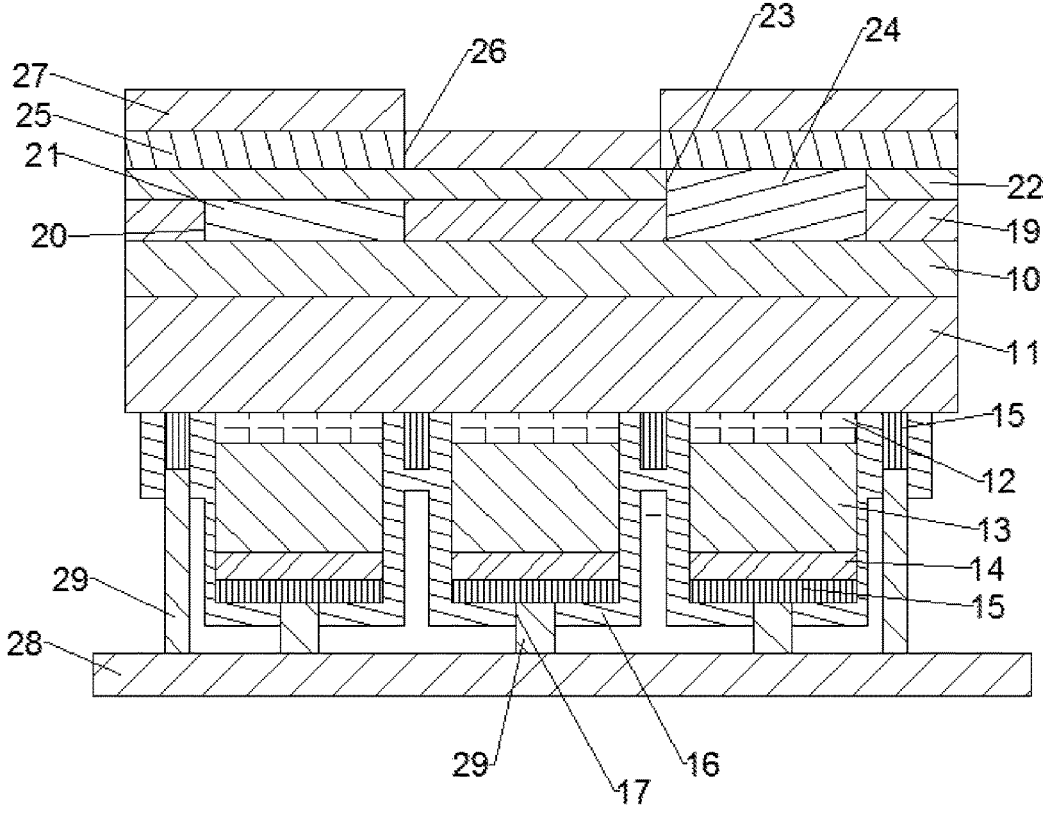

FIG. 3M is a schematic view of a structure of a display module according to one embodiment of the present application.

Figure 3N:
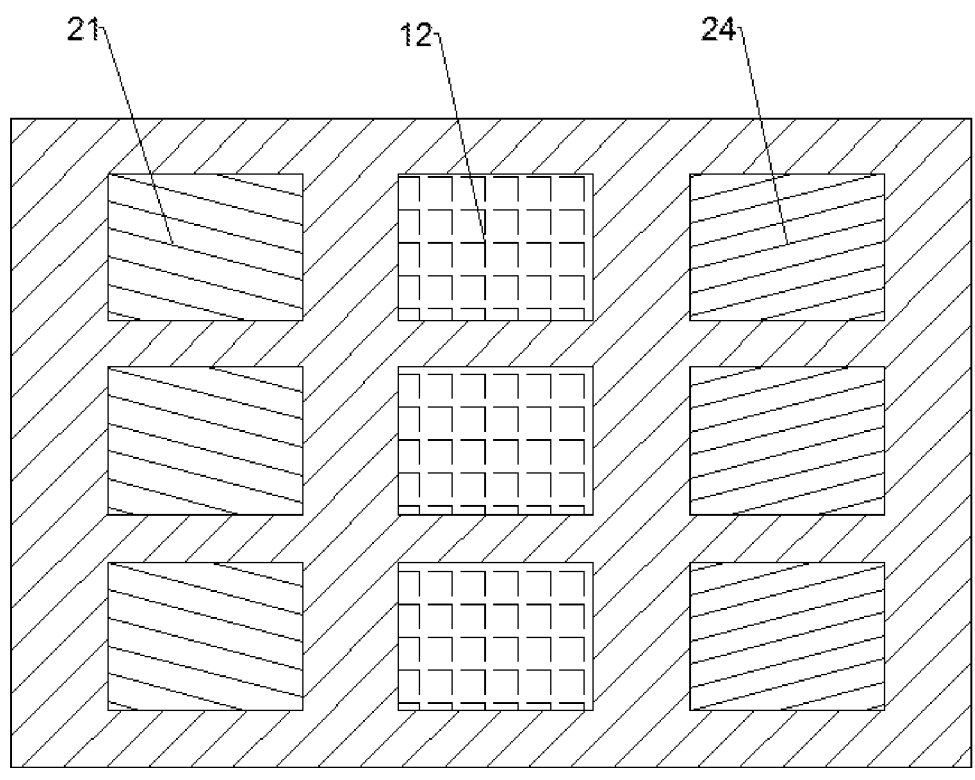

FIG. 3N is a top view of a display module according to one embodiment of the present application.

Figure 4:
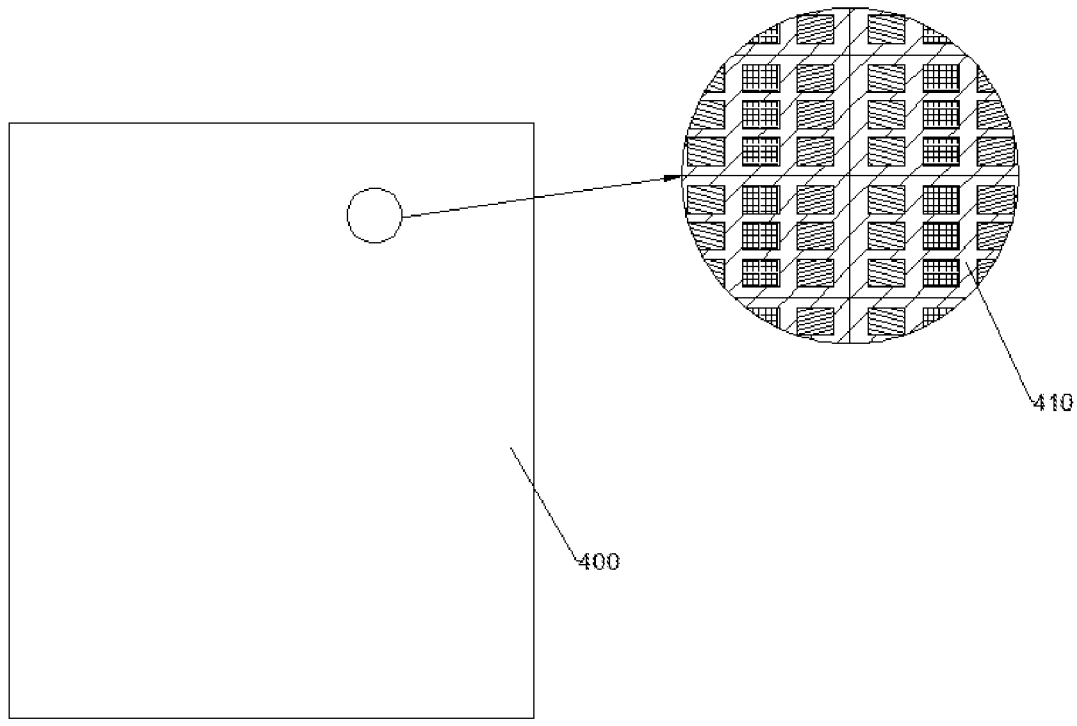

FIG. 4 is a schematic view of a structure of a display screen according to one embodiment of the present application.

DESCRIPTION OF THE DISCLOSURE

The present application will be described in further detail below with reference to the accompanying drawings and embodiments. It should be understood that the specific embodiments described herein are illustrative of the present application only instead of being restrictive. It should also be noted that, for ease of description, only some parts, but not all, of the structures associated with the present application are shown in the drawings.

Before discussing exemplary embodiments in more detail, it should be noted that some exemplary embodiments are described as treatments or methods depicted in the flow charts. Although the flow charts depict the steps as a sequential treatment, many of the steps can be implemented in parallel, concurrently, or simultaneously. Further, the sequence of the steps may be rearranged. The treatment may be terminated when the operations are completed, but may also have additional steps not included in the drawings. A treatment may correspond to a method, a function, a regulation, a subroutine, a subprogram, etc.

Furthermore, the terms "first", "second", and the like, may be used herein to describe various directions, acts, steps, or elements, and the like, but such directions, acts, steps, or elements are not limited by such terms. These terms are only used to distinguish one direction, act, step, or element from another. For example, a first opening may be referred to as a second opening, and similarly, a second opening may be referred to as a first opening, without departing from the scope of the present application. Both the first opening and the second opening are openings, but they are not the same opening. The terms "first", "second", and the like, are not to be construed as indicating or implying relative importance or implicitly indicating the number of technical features indicated. Therefore, the feature defined as "first" or "second" may explicitly or implicitly include one or more such features. In the description of the present application, "multiple" and "batch" mean at least two, for example, two, three, etc. unless specifically defined otherwise.

Embodiment 1

FIG. 1 is a schematic view of the flow chart of a manufacturing method for a display module provided in embodiment 1 of the present application. The embodiment applies to the manufacturing of an LED display screen. As shown in FIG. 1, the manufacturing method for a display module provided in embodiment 1 of the present application comprises:

S110, pre-processing the semiconductor epitaxial wafer to form a semiconductor device with a blue LED array.

In some embodiments, the semiconductor epitaxial wafer refers to a blue LED epitaxial structure, comprising, in a sequence from the substrate upwards: a sapphire substrate, a first channel layer, a blue light layer, and a second channel layer. The first channel layer is generally a blue light N-type GaN, the blue light layer is a blue light Quantum Well (QW), and the second channel layer is generally a blue light P-type GaN. The blue LED array refers to the scenario that multiple blue light units are arranged in an array. When the blue light units are powered on, blue light can be emitted. A semiconductor device with a blue LED array is the basis for manufacturing an LED display module. Therefore, the semiconductor epitaxial wafer needs to be pre-treated to form a blue LED array.

S120, forming a first transparent layer on a substrate surface of the semiconductor device.

In some embodiments, the first transparent layer may be formed on the substrate surface of the semiconductor device by means of deposition. The first transparent layer is mainly used for transmitting light, and the material thereof can be $SiO_2$, $MgF_2$, ITO, etc. It should be noted that the surface of the substrate means a surface where no first channel layer is provided.

S130, etching the first transparent layer to form a first opening exposing the substrate.

In some embodiments, the semiconductor device is sequentially subjected to the steps of spin coating, pre-baking, photoetching, developing, post-baking, etc., defining a first opening pattern in the first transparent layer, and then etching away the first transparent layer at the first opening pattern by means of plasma etching, thereby forming a first opening exposing the substrate in the first transparent layer.

S140, forming a first quantum dot layer on the substrate surface exposed by the first opening and the surface of the first transparent layer.

In some embodiments, the first quantum dot is a quantum dot capable of emitting light of a color other than blue light, such as a red light quantum dot or a green light quantum dot. The first quantum dot layer may be formed on the substrate surface exposed by the first opening and the surface of the first transparent layer by spin coating or deposition.

S150, etching away the first quantum dot layer in the outer region of the first opening by plasma etching, and remaining the first quantum dot layer inside the first opening.

In some embodiments, the semiconductor device processed in the above steps can be placed in Inductive Coupled Plasma Emission Spectrometer (ICP) or Reactive Ion Etching (RIE) equipment, and the first quantum dot layer in the outer region of the first opening is etched away by plasma etching so that the first quantum dot layer inside the first opening remains, thereby printing the first quantum dot inside the first opening. The principle of plasma etching is that the gas exposed to the electron region forms a plasma, and the generated ionized gas and the gas composed of released high-energy electrons form plasma or ion. When an ionized gas atom is accelerated by an electric field, sufficient force and surface expulsive force are released to tightly bind it to the material or etch the surface. In this embodiment, the printing of the first quantum dot is enabled to achieve sub-micron size or even nanometer size by using plasma etching.

S160, forming a DBR film layer that filters blue light.

In some embodiments, the Distributed Bragg Reflector (DBR) film is a periodic structure formed by alternatingly arranging two materials with different refractive indexes, and the transmission of light of the DBR film can be changed by changing the refractive index, thickness, and gap of the materials. One layer of the DBR film layer that filters blue light may be formed on the surface of the first quantum dot layer so that blue light-transmitting at the first quantum dot layer may be avoided.

The manufacturing method for a display module provided in embodiment 1 of the present application may enable the printing of the first quantum dot to achieve a sub-micron size or even a nanometer size by using plasma etching, and improve the printing accuracy of the quantum dot in the manufacturing method for an LED display screen.

Embodiment 2

FIG. 2 is a schematic view of the flow chart of a manufacturing method for a display module provided in embodiment 2 of the present application. The embodiment is a modification of the above-mentioned embodiment. As shown in FIG. 2, the manufacturing method for a display module provided in embodiment 2 of the present application comprises:

S201, performing mesa etching on the semiconductor epitaxial wafer to expose a portion of the first channel layer to form a blue LED array.

In an embodiment, the structure of the semiconductor epitaxial wafer is as shown in FIG. 3A, comprising a sapphire substrate 10, a first channel layer 11, a blue light layer 12, and a second channel layer 13. The first channel layer 11 is blue light N-type GaN, the blue light layer 12 is blue light QW, and the second channel layer 13 is blue light P-type GaN.

Performing mesa etching on the semiconductor epitaxial wafer is to use photolithography and plasma etching to enable the semiconductor to initially form a blue LED array. The structure of the etched semiconductor epitaxial wafer is as shown in FIG. 3B.

S202, forming a current diffusion layer on the surface of the second channel layer of the blue light array.

In some embodiments, the current diffusion layer is used primarily to form an ohmic contact with the P-type GaN, and therefore, the current diffusion layer is formed on the surface of the second channel layer. The current diffusion layer may be formed sequentially by the steps of photoetching, metal evaporation, and photoresist stripping, wherein the material of the current diffusion layer may be ITO or Ni/Au. As an example, the structure of the semiconductor epitaxial wafer forming the current diffusion layer 14 is as shown in FIG. 3C.

In other embodiments, the current diffusion layer may not be formed. A reflective electrode may be directly formed on the surface of the second channel layer and an exposed surface of the first channel layer.

S203, forming a reflective electrode on the surface of the current diffusion layer and the exposed surface of the first channel layer.

In some embodiments, the reflective electrode is used primarily to increase the luminous efficiency of the LED. The manufacturing of the reflective electrode can also adopt the steps of photoetching, metal evaporation, and photoresist stripping. In one embodiment, the material of the reflective electrode is metal materials such as Ti/AL/Ti/Au, Cr/Ti/Au, or Pt/Au. As an example, the structure of the semiconductor epitaxial wafer forming a reflective electrode 15 is as shown in FIG. 3D.

S204, forming a passivation layer covering the reflective electrode.

In some embodiments, the passivation layer is primarily used to prevent external impurities from entering the inside of the epitaxial wafer, and the material thereof, in one embodiment, is $SiO_2$ or $Si_3N_4$, and the passivation layer may be formed by means of deposition. As an example, the structure of the semiconductor epitaxial wafer forming a passivation layer 16 is as shown in FIG. 3E.

S205, etching the passivation layer to form a bonding hole exposing a portion of the reflective electrode.

In some embodiments, a semiconductor device generally needs to be combined with a driving substrate to form a display module; the driving substrate supplies power to the semiconductor device; quantum dots in the semiconductor device emit light of a corresponding color after being energized; the display module is connected to the driving substrate at a bonding hole. In one embodiment, the bonding hole is formed by photoetching and plasma etching. As an example, the structure of the semiconductor epitaxial wafer forming a bonding hole 17 is as shown in FIG. 3E.

S206, forming a protective film on the surface of the blue LED array after the bonding hole is formed.

In some embodiments, after the above-mentioned steps S201-S205, the semiconductor epitaxial wafer has been processed to form a semiconductor device having a blue LED array. One layer of the protective film is formed on the surface of the blue LED array so that affecting the blue LED array in the subsequent preparation steps may be avoided. The protective film uses a material that is easy to rip off, such as a blue film, a photoresist, or a UV (Ultraviolet Rays) film. As an example, the structure of the semiconductor device forming a protective film 18 is as shown in FIG. 3F.

S207, polishing the substrate of the semiconductor device to a mirror surface.

In some embodiments, it is determined whether the thickness of the sapphire substrate meets the requirement. If the sapphire substrate is too thick, the sapphire substrate needs to be thinned to improve the heat dissipation performance of the device. Then, the sapphire substrate with the desired thickness is polished to a mirror surface, so that the surface of the sapphire substrate is more bright and smooth to remove the surface damage layer formed by the damage to the sapphire substrate in the aforementioned process, eliminate the residual stress, and prevent the semiconductor device from bending deformation or splintering in the subsequent process.

S208, forming a first transparent layer on a substrate surface of the semiconductor device.

In some embodiments, the first transparent layer capable of transmitting light is formed on the polished substrate surface by means of deposition, and the material of the first transparent layer, in one embodiment, is $SiO_2$, $MgF_2$, ITO, etc. As an example, the structure of the semiconductor device forming a first transparent layer 19 is as shown in FIG. 3G.

S209, etching the first transparent layer to form a first opening exposing the substrate.

In some embodiments, the semiconductor device is sequentially subjected to the steps of spin coating, pre-baking, photoetching, developing, post-baking, etc., defining a first opening pattern in the first transparent layer, and then etching away the first transparent layer at the first opening pattern by means of plasma etching, thereby forming a first opening exposing the substrate in the first transparent layer. As an example, the structure of the first opening 20 is as shown in FIG. 3G.

S210, forming a first quantum dot layer on the substrate surface exposed by the first opening and the surface of the first transparent layer.

In some embodiments, the first quantum dot is a quantum dot capable of emitting light of a color other than blue light, such as a red light quantum dot or a green light quantum dot. In one embodiment, the first quantum dot layer is formed on the substrate surface exposed by the first opening and the surface of the first transparent layer by spin coating or deposition. As an example, the first quantum dot is a red light quantum dot, and the semiconductor device forming the first quantum dot layer 21 is as shown in FIG. 3H.

S211, etching away the first quantum dot layer in the outer region of the first opening by plasma etching, and remaining the first quantum dot layer inside the first opening.

In some embodiments, the semiconductor device processed in the above steps can be placed in ICP or RIE equipment, and the first quantum dot layer in the outer region of the first opening is etched away by plasma etching so that the first quantum dot layer inside the first opening remains, thereby printing the first quantum dot inside the first opening. As an example, the semiconductor device after plasma etching is completed is as shown in FIG. 3I.

S212, forming a second transparent layer on the surface of the first transparent layer and the surface of the first quantum dot layer.

S213, etching the second transparent layer to form a second opening exposing the substrate.

S214, forming a second quantum dot layer on the substrate surface exposed by the second opening and the surface of the second transparent layer.

S215, etching away the second quantum dot layer in the outer region of the second opening by plasma etching, and remaining the second quantum dot layer inside the second opening.

In some embodiments, the manufacturing mode of steps S212-S215 is similar to that of steps S208-S2011, except that the positions of the quantum dots and the second openings are different. The process procedure can be referred to the description of steps S208-S2011. As an example, the second quantum dot is a green light quantum dot. Referring to FIG. 3J, a second transparent layer 22 is formed on the first transparent layer 19 and the first quantum dot layer 21, the second transparent layer 22 is etched to form a second opening 23 exposing the surface of the substrate 10, and a second quantum dot layer 24 is formed inside the second opening 23 by deposition and plasma etching.

S216, forming a DBR film layer that filters blue light on the surface of the second quantum dot layer and the surface of the second transparent layer.

In some embodiments, to prevent the transmission of blue light at the first quantum dot layer and the second quantum dot layer, one layer of the DBR film layer filtering blue light may be formed on the surface of the second quantum dot layer and the surface of the second transparent layer. As an example, a semiconductor device forming DBR film layer 25 is as shown in FIG. 3K.

S217, etching the DBR film layer to form a light-transmitting hole exposing a portion of the second transparent layer.

In some embodiments, the DBR film layer formed in step S216 completely covers the light-transmitting surface of the semiconductor device, i. e. the blue light array portion is also covered, so it is necessary to etch the DBR film layer to form a light-transmitting hole for transmitting the blue light emitted from the blue light array. As an example, a semiconductor device forming a light-transmitting hole 26 is as shown in FIG. 3K.

S218, forming a transparent protective layer on the surface of the DBR film layer and the surface of the second transparent layer exposed by the light-transmitting hole.

In some embodiments, to prevent the internal structure of the semiconductor device from being damaged, one transparent protective layer is formed on the surface of the semiconductor device with the DBR film layer, both for protection and light transmission. As an example, a semiconductor device forming a transparent protective layer 27 is as shown in FIG. 3L.

S219, removing the protective film on the surface of the blue LED array to expose the bonding hole.

S220, bonding the bonding hole with the bonding metal of the driving substrate.

In some embodiments, removing the protective film on the surface of the blue LED array, and bonding the bonding hole of the semiconductor device with the bonding metal of the driving substrate are carried out so that the semiconductor device and the driving substrate are combined to form a display module, the driving substrate supplies power to the semiconductor device, and quantum dots in the semiconductor device will emit light of a corresponding color after being energized. One LED display screen is composed of multiple such display modules. As an example, after the bonding hole 17 is bonded with the bonding metal 29 on the driving substrate 28, the structure of the display module is as shown in FIG. 3M. The top view of the display module is as shown in FIG. 3N. It can be seen from FIG. 3N that the left side and right side of the display module are respectively the first quantum dot layer 21 (red light quantum dot) and the second quantum dot layer 24 (green light quantum dot), and a blue light layer 12 (blue light QW) is in the middle, achieving full-color.

The manufacturing method for a display module provided in one embodiment of the present application enables the printing of quantum dots to achieve a sub-micron size or even a nanometer size by using plasma etching so that the printing accuracy of the quantum dots in the manufacturing method for an LED display screen may be improved.

Embodiment 3

FIG. 4 is a schematic view of a structure of a display screen provided in one embodiment of the present application. A display screen 400 provided in embodiment 3 of the present application comprises multiple display modules 410, and the display modules 410 are prepared by the manufacturing method for a display module provided in any embodiment of the present application.

Referring to FIG. 3M, the display module includes a semiconductor device with a blue LED array, a first transparent layer 19, a first quantum dot layer 21, and a DBR film layer 25 that filters blue light. The semiconductor device includes a substrate 10 and a blue LED array formed on the substrate. The first transparent layer 19 is formed on the surface of one side of the substrate 10 that deviates from the blue LED array. The first transparent layer 19 is provided with a first opening 20 that reaches the substrate, and the first quantum dot is filled in the first opening 20, The DBR film layer 25 is located on the surface of one side of the first quantum dot that deviates from the substrate. The blue LED array includes multiple blue LED columns arranged in the array. The first quantum dot is directly corresponding to the first part of the blue LED column. The first quantum dot is used for color conversion of the first part of the blue LED column corresponding to it to obtain other colors different from the blue light. The second part of the blue LED column still emits blue light without being subjected to color conversion of the quantum dot. In this way, at least two colors can realize color display.

In some embodiments, the display module further includes a second transparent layer 22 and a second quantum dot layer 24, the second transparent layer 22 is located between the first transparent layer 19 and the DBR film layer 25, the second transparent layer 22 covers the first transparent layer 19 and the first quantum dot layer 21, the second transparent layer 22 is provided with a second opening 23 that reaches the substrate, the second quantum dot is filled in the second opening 23, and the second quantum dot is directly corresponding to the third part of the blue LED column, The second quantum dot is used for color conversion of the third part of the blue LED column corresponding to it to obtain other colors different from the blue light and the first quantum dot. In this way, the three colors can realize color display. The DBR film layer 25 is located on the surfaces of one side of the first quantum dot and the second quantum dot that deviate from the substrate.

Specifically, the first quantum dot and the second quantum dot can be red light quantum dot and green light quantum dot respectively, and full color display can be achieved through three colors of red, green and blue.

The application provides a manufacturing method for a display module, and a display screen to improve the printing accuracy of quantum dots in the manufacturing method for an LED display screen.

According to the first aspect, an embodiment of the present application provides a manufacturing method for a display module, comprising:

forming a semiconductor device having a blue LED array by pre-processing a semiconductor epitaxial wafer;

forming a first transparent layer on a surface of a substrate of the semiconductor device;

forming a first opening exposing the substrate by etching the first transparent layer;

forming a first quantum dot layer on the substrate surface exposed by the first opening and the first transparent layer surface;

etching away the first quantum dot layer on the periphery of the first opening by plasma etching, and remaining the first quantum dot layer inside the first opening;

and forming a DBR film layer that filters blue light.

In some embodiments, the semiconductor epitaxial wafer comprises a first channel layer, a blue light layer, and a second channel layer sequentially provided on the substrate.

In some embodiments, the forming a semiconductor device having a blue LED array by pre-processing a semiconductor epitaxial wafer comprises:

performing mesa etching on the semiconductor epitaxial wafer to expose a portion of the first channel layer to form the blue LED array;

and forming a current diffusion layer on the surface of the second channel layer of the blue LED array.

In some embodiments, forming a semiconductor device having a blue LED array by pre-processing a semiconductor epitaxial wafer further comprises:

forming a reflective electrode on the surface of the current diffusion layer and the exposed surface of the first channel layer.

In some embodiments, forming a semiconductor device having a blue LED array by pre-processing a semiconductor epitaxial wafer further comprises:

forming a passivation layer covering the reflective electrode;

forming a bonding hole exposing a portion of the reflective electrode by etching the passivation layer;

and forming a protective film on the surface of the blue LED array after the bonding hole is formed.

In some embodiments, forming a semiconductor device having a blue LED array by pre-processing a semiconductor epitaxial wafer comprises:

performing mesa etching on the semiconductor epitaxial wafer to expose a portion of the first channel layer to form the blue LED array;

forming a current diffusion layer on the surface of the second channel layer of the blue LED array;

forming a reflective electrode on the surface of the current diffusion layer and an exposed surface of the first channel layer;

forming a passivation layer covering the reflective electrode;

forming a bonding hole exposing a portion of the reflective electrode by etching the passivation layer;

and forming a protective film on the surface of the blue LED array after the bonding hole is formed.

In some embodiments, before forming the first transparent layer on the substrate surface of the semiconductor device, the method further comprises:

polishing the substrate of the semiconductor device to a mirror surface.

In some embodiments, the method further comprises:

forming a second transparent layer on the surface of the first transparent layer and the surface of the first quantum dot layer;

forming a second opening exposing the substrate by etching the second transparent layer;

forming a second quantum dot layer on the surface of the substrate exposed by the second opening and the surface of the second transparent layer;

and etching away the second quantum dot layer on the periphery of the second opening by plasma etching, and remaining the second quantum dot layer inside the second opening.

In some embodiments, the first quantum dot layer and the second quantum dot layer are respectively red quantum dot layer and green quantum dot layer.

In some embodiments, before forming a DBR film layer that filters blue light, the method further comprises:

forming a second transparent layer on the surface of the first transparent layer and the surface of the first quantum dot layer;

forming a second opening exposing the substrate by etching the second transparent layer;

forming a second quantum dot layer on the surface of the substrate exposed by the second opening and the surface of the second transparent layer;

and etching away the second quantum dot layer on the periphery of the second opening by plasma etching, and remaining the second quantum dot layer inside the second opening.

In some embodiments, the forming a DBR film layer that filters blue light comprises:

forming a DBR film layer that filters blue light on the surface of the second quantum dot layer and the surface of the second transparent layer;

and etching the DBR film layer to form a light-transmitting hole exposing a portion of the second transparent layer.

In some embodiments, after forming a DBR film layer that filters blue light, the method further comprises:

forming a transparent protective layer on the surface of the DBR film layer and the surface of the second transparent layer exposed by the light-transmitting hole.

In some embodiments, after forming a DBR film layer that filters blue light, the method further comprises:

removing the protective film on the surface of the blue LED array to expose the bonding hole;

and bonding the bonding hole with a bonding metal of a driving substrate.

In some embodiments, the forming a first quantum dot layer on the substrate surface exposed by the first opening and the surface of the first transparent layer comprises:

forming the first quantum dot layer on the substrate surface exposed by the first opening and the surface of the first transparent layer by spin coating or deposition.

In some embodiments, a material of the first transparent layer is selected from $SiO_2$, $MgF_2$, or ITO.

In some embodiments, the DBR film layer is a periodic structure formed by an alternate arrangement of two materials with different refractive indexes.

According to the second aspect, an embodiment of the present application provides a display screen, comprising multiple display modules, wherein the display modules are prepared by a manufacturing method for a display module, and the manufacturing method for the display module comprises:

forming a semiconductor device having a blue LED array by pre-processing a semiconductor epitaxial wafer;

forming a first transparent layer on a substrate surface of the semiconductor device;

forming a first opening exposing the substrate by etching the first transparent layer;

forming a first quantum dot layer on the substrate surface exposed by the first opening and a surface of the first transparent layer;

etching away the first quantum dot layer on the periphery of the first opening by plasma etching, and remaining the first quantum dot layer inside the first opening;

and forming a DBR film layer that filters blue light.

In some embodiments, the display module comprises a semiconductor device with a blue LED array, a first transparent layer, a first quantum dot layer, and a DBR film layer that filters blue light, the semiconductor device comprises a substrate and the blue LED array formed on the substrate, the blue LED array comprises multiple blue LED columns arranged in an array, the first transparent layer is formed on a surface of one side of the substrate that deviates from the blue LED array, the first transparent layer is provided with a first opening that reaches the substrate, the first quantum dot is filled in the first opening, and the DBR film layer is located on the surface of one side of the first quantum dot that deviates from the substrate.

In some embodiments, the display module further comprises a second transparent layer and a second quantum dot layer, the second transparent layer is located between the first transparent layer and the DBR film layer, the second transparent layer covers the first transparent layer and the first quantum dot layer, the second transparent layer is provided with a second opening that reaches the substrate, the second quantum dot is filled in the second opening, and the DBR film layer is located on the surfaces of one side of the first quantum dot and the second quantum dot that deviate from the substrate.

The manufacturing method for the display module comprises:

forming a semiconductor device having a blue LED array by pre-processing a semiconductor epitaxial wafer;

forming a first transparent layer on a substrate surface of the semiconductor device;

forming a first opening exposing the substrate by etching the first transparent layer;

forming a first quantum dot layer on the substrate surface exposed by the first opening and a surface of the first transparent layer;

etching away the first quantum dot layer in the outer region of the first opening by plasma etching, and remaining the first quantum dot layer inside the first opening;

and forming a DBR film layer that filters blue light.

What is claimed is:

1. A manufacturing method for a display module, comprising:

forming a semiconductor device having a blue LED array by pre-processing a semiconductor epitaxial wafer;

forming a first transparent layer on a surface of a substrate of said semiconductor device;

forming a first opening exposing said substrate by etching said first transparent layer;

forming a first quantum dot layer on said substrate surface exposed by said first opening and said first transparent layer surface;

etching away said first quantum dot layer in the outer region of said first opening by plasma etching, and remaining said first quantum dot layer inside said first opening; and forming a DBR film layer that filters blue light.

2. The method of claim 1, wherein said semiconductor epitaxial wafer comprises a first channel layer, a blue light layer, and a second channel layer sequentially provided on said substrate.

3. The method of claim 2, wherein said forming a semiconductor device having a blue LED array by pre-processing a semiconductor epitaxial wafer comprises:

performing mesa etching on said semiconductor epitaxial wafer to expose a portion of said first channel layer to form said blue LED array; and forming a current diffusion layer on said surface of said second channel layer of said blue LED array.

4. The method of claim 3, wherein forming a semiconductor device having a blue LED array by pre-processing a semiconductor epitaxial wafer further comprises:

forming a reflective electrode on said surface of said second channel layer and an exposed surface of said first channel layer.

5. The method of claim 3, wherein forming a semiconductor device having a blue LED array by pre-processing a semiconductor epitaxial wafer further comprises:

forming a passivation layer covering said reflective electrode;

forming a bonding hole exposing a portion of said reflective electrode by etching said passivation layer; and forming a protective film on said surface of said blue LED array after said bonding hole is formed.

6. The method of claim 2, wherein forming a semiconductor device having a blue LED array by pre-processing a semiconductor epitaxial wafer comprises:

performing mesa etching on said semiconductor epitaxial wafer to expose a portion of said first channel layer to form said blue LED array;

forming a current diffusion layer on said surface of said second channel layer of said blue LED array;

forming a reflective electrode on said surface of said current diffusion layer and an exposed surface of said first channel layer;

forming a passivation layer covering said reflective electrode;

forming a bonding hole exposing a portion of said reflective electrode by etching said passivation layer; and forming a protective film on said surface of said blue LED array after said bonding hole is formed.

7. The method of claim 6, wherein before forming said first transparent layer on said substrate surface of said semiconductor device, said method further comprises:

polishing said substrate of said semiconductor device to a mirror surface.

8. The method of claim 1, wherein before forming said first transparent layer on said substrate surface of said semiconductor device, said method further comprises:

polishing said substrate of said semiconductor device to a mirror surface.

9. The method of claim 6, wherein before forming a DBR film layer that filters blue light, said method further comprises:

forming a second transparent layer on said surface of said first transparent layer and said surface of said first quantum dot layer;

forming a second opening exposing said substrate by etching said second transparent layer;

forming a second quantum dot layer on said surface of said substrate exposed by said second opening and said surface of said second transparent layer; and etching away said second quantum dot layer in the outer region of said second opening by plasma etching, and remaining said second quantum dot layer inside said second opening.

10. The method of claim 9, wherein said first quantum dot layer and said second quantum dot layer are respectively red quantum dot layer and green quantum dot layer.

11. The method of claim 1, wherein before forming a DBR film layer that filters blue light, said method further comprises:

forming a second transparent layer on said surface of said first transparent layer and said surface of said first quantum dot layer;

forming a second opening exposing said substrate by etching said second transparent layer;

forming a second quantum dot layer on said surface of said substrate exposed by said second opening and said surface of said second transparent layer; and etching away said second quantum dot layer on a periphery of said second opening by plasma etching, and remaining said second quantum dot layer inside said second opening.

12. The method of claim 9, wherein said forming a DBR film layer that filters blue light comprises:

forming a DBR film layer that filters blue light on said surface of said second quantum dot layer and said surface of said second transparent layer; and etching said DBR film layer to form a light-transmitting hole exposing a portion of said second transparent layer.

13. The method of claim 12, after forming a DBR film layer that filters blue light, said method further comprising:

forming a transparent protective layer on said surface of said DBR film layer and said surface of said second transparent layer exposed by said light-transmitting hole.

14. The method of claim 6, after forming a DBR film layer that filters blue light, said method further comprising:

removing said protective film on said surface of said blue LED array to expose said bonding hole; and bonding said bonding hole with a bonding metal of a driving substrate.

15. The method of claim 1, wherein said forming a first quantum dot layer on said substrate surface exposed by said first opening and a surface of said first transparent layer comprises:

forming said first quantum dot layer on said substrate surface exposed by said first opening and said surface of said first transparent layer by spin coating or deposition.

16. The method of claim 1, wherein a material of said first transparent layer is selected from $SiO_2$, $MgF_2$, or ITO.

17. The method of claim 1, wherein said DBR film layer is a periodic structure formed by alternate arrangement of two materials with different refractive indexes.

* * * * *